US012126270B2

(12) United States Patent
Takagi

(10) Patent No.: US 12,126,270 B2
(45) Date of Patent: Oct. 22, 2024

(54) CASING FOR ELECTRICAL APPARATUS AND POWER CONTROL APPARATUS

(71) Applicant: KYOCERA Corporation, Kyoto (JP)

(72) Inventor: Takafumi Takagi, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 685 days.

(21) Appl. No.: 17/281,244

(22) PCT Filed: Oct. 2, 2019

(86) PCT No.: PCT/JP2019/039004
§ 371 (c)(1),
(2) Date: Jan. 13, 2022

(87) PCT Pub. No.: WO2020/090337
PCT Pub. Date: May 7, 2020

(65) Prior Publication Data
US 2022/0224240 A1 Jul. 14, 2022

(30) Foreign Application Priority Data
Oct. 29, 2018 (JP) ................................. 2018-203257

(51) Int. Cl.
*H05K 5/06* (2006.01)
*H02M 7/00* (2006.01)
*H02S 40/32* (2014.01)

(52) U.S. Cl.
CPC ............ *H02M 7/003* (2013.01); *H05K 5/069* (2013.01); *H02S 40/32* (2014.12)

(58) Field of Classification Search
CPC ........ H02M 7/003; H02M 7/48; H05K 5/069; H05K 5/0214; H05K 7/1432; H05K 7/20918; H02S 40/32
See application file for complete search history.

(56) References Cited

U.S. PATENT DOCUMENTS 5,175,873 A * 12/1992 Goldenberg ........... H04B 1/086
361/679.08
5,713,048 A * 1/1998 Hayakawa ............. G03B 17/08
396/25
(Continued)

FOREIGN PATENT DOCUMENTS

JP S62140809 U 9/1987
JP 2012182983 A 9/2012
(Continued)

*Primary Examiner* — Imani N Hayman
*Assistant Examiner* — Theron S Milliser
(74) *Attorney, Agent, or Firm* — HAUPTMAN HAM, LLP

(57) ABSTRACT

A casing (2) for an electrical apparatus for housing an electrical apparatus (3) includes: a casing main body (10); a cover body (20) that includes a flat plate-like cover portion (21), a first curved cover portion (24), and a second curved cover portion (25) and is attached to the casing body (10) to cover an opening (10b); a first sealing member (5) and a second sealing member (6) that are arranged between the casing body (10) and the flat plate-like cover portion (21) and seal between the casing body (10) and the flat plate-like cover portion (21); and a communication portion (60) that is provided inside the first curved cover portion (24) and the second curved cover portion (25) in a manner extending in a direction along respective sides (21a, 21b) of the flat plate-like cover portion (21) and communicates with outside between the first curved cover portion (24) and the casing body (10) and between the second curved cover portion (25) and the casing body (10). A power control apparatus (1) includes the casing (2) for an electrical apparatus and the electrical apparatus (3) housed in the casing (2) for an electrical apparatus.

11 Claims, 9 Drawing Sheets

(56) References Cited

U.S. PATENT DOCUMENTS

| | | | | |
|---|---|---|---|---|
| 5,946,501 A | * | 8/1999 | Hayakawa | G03B 17/08 |
| | | | | 396/25 |
| 6,102,498 A | | 8/2000 | Kohler et al. | |
| 6,532,152 B1 | * | 3/2003 | White | G02F 1/133308 |
| | | | | 312/223.1 |
| 7,255,228 B2 | * | 8/2007 | Kim | A45C 11/00 |
| | | | | 206/320 |
| 7,850,032 B2 | * | 12/2010 | Carnevali | B63B 49/00 |
| | | | | 206/811 |
| 7,926,818 B2 | * | 4/2011 | Isono | F16J 15/062 |
| | | | | 277/630 |
| 8,701,912 B2 | * | 4/2014 | Carnevali | B63B 49/00 |
| | | | | 206/811 |
| 11,751,348 B2 | * | 9/2023 | Takagi | H05K 5/03 |
| | | | | 361/679.01 |
| 2006/0021889 A1 | * | 2/2006 | Kim | A45C 11/00 |
| | | | | 206/320 |
| 2006/0169689 A1 | * | 8/2006 | Carnevali | B63B 49/00 |
| | | | | 220/4.21 |
| 2008/0157485 A1 | * | 7/2008 | Isono | F16J 15/025 |
| | | | | 277/316 |
| 2011/0049175 A1 | * | 3/2011 | Carnevali | B63B 49/00 |
| | | | | 220/849 |
| 2016/0234953 A1 | | 8/2016 | Ellingson | |
| 2022/0022335 A1 | * | 1/2022 | Takagi | H05K 5/03 |
| 2022/0224240 A1 | * | 7/2022 | Takagi | H05K 7/1432 |

FOREIGN PATENT DOCUMENTS

| | | |
|---|---|---|
| JP | 2013138536 A | 7/2013 |
| JP | 201860828 A | 4/2018 |

* cited by examiner

CASING FOR ELECTRICAL APPARATUS AND POWER CONTROL APPARATUS

CROSS REFERENCE TO RELATED APPLICATION

This application is a National Phase of International Application Number PCT/JP2019/039004 filed Oct. 2, 2019, and claims priority to and the benefit of Japanese Patent Application No. 2018-203257 filed on Oct. 29, 2018, the entire contents of which are incorporated herein by reference.

TECHNICAL FIELD

The present disclosure relates to a casing for an electrical apparatus and a power control apparatus.

BACKGROUND

An electric power control apparatus such as a power control apparatus (a power converter) in which an electrical apparatus that is connected to a solar cell and has a function of converting DC power from the solar cell into AC power is housed in a casing is becoming popular mainly for a domestic use. Because such a power control apparatus is often installed outdoors, the casing for housing the electrical apparatus needs to have a high waterproof property.

For example, PTL 1 set forth below discloses a casing that includes a casing body having an opening and a front cover for covering the opening of the casing body. The front cover has a structure in which a front cover front surface for covering the opening of the casing body and a front cover top surface for covering a top surface of the casing body are integrally formed such that an upper side of the casing has a double structure in which the front cover top surface and the top surface of the casing body overlap with each other, and thus improves the waterproof property.

CITATION LIST

Patent Literature

PTL 1: JP-A-2018-60828

SUMMARY

A casing for an electrical apparatus according to an embodiment of the present disclosure is a casing for an electrical apparatus that houses an electrical apparatus and includes: a casing body having an opening; a cover body that includes a flat plate-like cover portion having a rectangular shape and a curved cover portion continuous to one side of the flat plate-like cover portion, and is attached to the casing body to cover the opening; a sealing member that is arranged between the casing body and the flat plate-like cover portion and seals between the casing body and the flat plate-like cover portion; and a communication portion that is provided inside the curved cover portion in a manner extending along the one side of the flat plate-like cover portion and communicates with outside between the curved cover portion and the casing body.

Further, a power control apparatus according to an embodiment of the present disclosure includes any casing for an electrical apparatus according to the present disclosure and an electrical apparatuses housed in the casing for an electrical apparatus.

DETAILED DESCRIPTION

A conventional casing for a power control apparatus is required to have improved (aesthetic) design as well as a waterproof property described above.

An object of the present disclosure is to provide a casing for an electrical apparatus that has an improved design and ensures functionality, and a power control apparatus.

According to the embodiment of the present disclosure, a casing for an electrical apparatus that has an improved design and ensures functionality and a power control apparatus can be provided.

Hereinafter, an embodiment of the present disclosure will be illustrated in detail with reference to the drawings.

Figure 1:
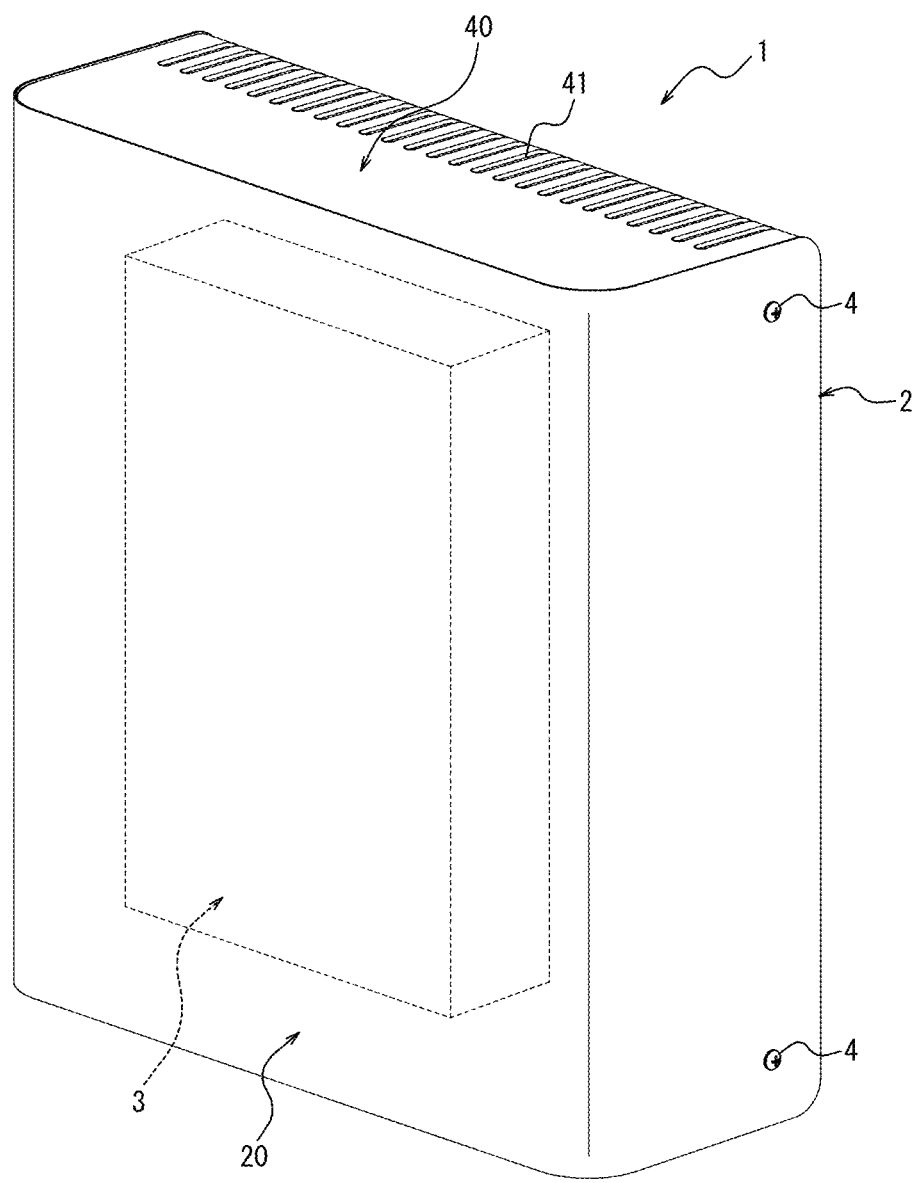
FIG. 1 is a perspective view of a power control apparatus according to an embodiment of the present disclosure.

A power control apparatus 1 according to the present embodiment includes a casing 2 for an electrical apparatus and an electrical apparatus 3 housed in the casing 2 for an electrical apparatus, as illustrated in FIG. 1.

The electrical apparatus 3 schematically illustrated in FIG. 1 is connected to, for example, a solar cell installed on a roof of a house and has a function of converting DC power generated by the solar cell into AC power and outputting the AC power to an electric system of the house. That is, the power control apparatus 1 is configured as a power control apparatus (a power converter) for a domestic use.

The power control apparatus 1 may have a configuration in which the casing 2 for an electrical apparatus houses, for example, a plurality of types of electrical apparatuses having different functions or configurations such as a fuel cell, a storage battery, a ventilation fan, or the like, in addition to the electrical apparatus 3 having the power conversion function as described above. As the storage battery mentioned above, for example, a lithium ion battery or a nickel hydrogen battery can be used. The casing 2 for an electrical apparatus can also house a member such as a heat insulating material or a cushioning material, in addition to the electrical apparatus 3. Further, the electrical apparatus 3 housed in the casing 2 for an electrical apparatus is not limited to one having the power conversion function for the solar cell as described above and may be an electrical apparatus that has other functions or configurations such as, for example, a fuel cell, a transformer apparatus, or an apparatus having a function of supplying electric power to a commercial power system.

The power control apparatus 1 may be installed outdoors. In the present embodiment, the power control apparatus 1 is installed, for example, on an exterior wall of a house by using mounting brackets, a pedestal, or the like.

The power control apparatus 1 is not limited to be installed outdoors but may be installed in other places including indoors.

Figure 2:
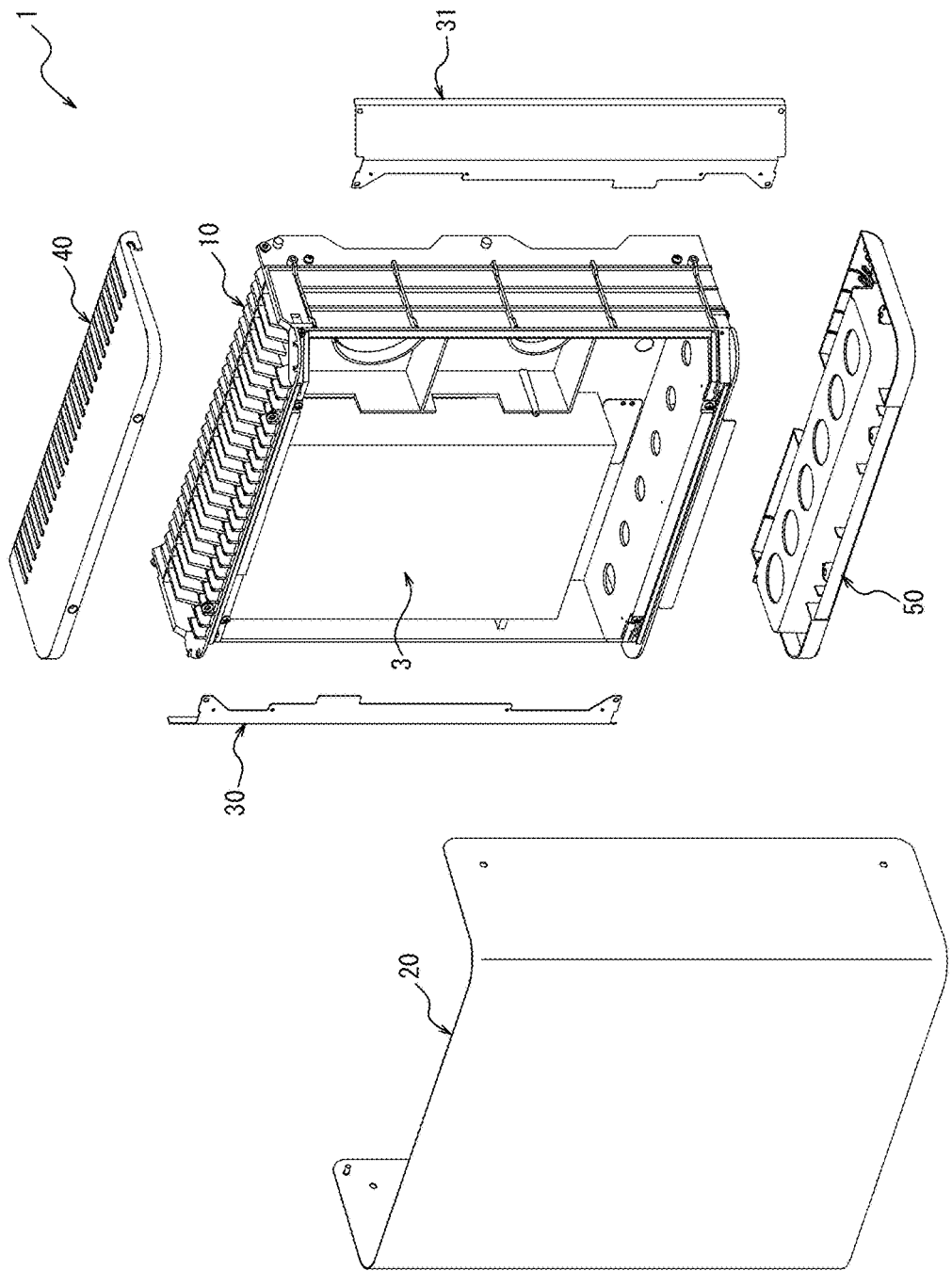
FIG. 2 is an exploded perspective view of the power control apparatus illustrated in FIG. 1.

The casing 2 for an electrical apparatus includes a casing body 10, a cover body 20, a first partition wall 30, a second partition wall 31, a top cover 40, and a bottom cover 50, as illustrated in FIG. 2.

Figure 3:
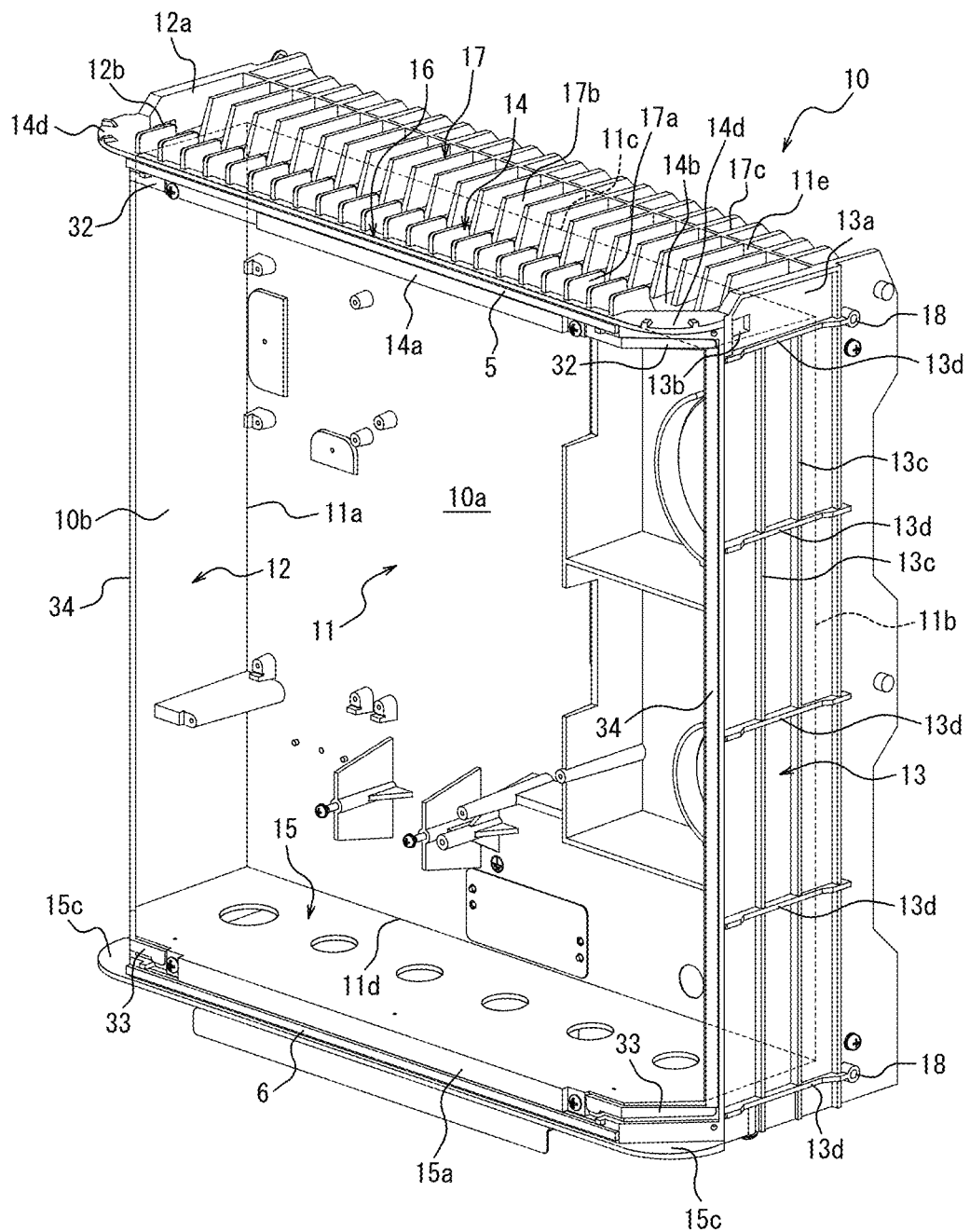
FIG. 3 is a perspective view of a casing body illustrated in FIG. 2.

As illustrated in FIG. 3, the casing body 10 has a box shape including a first wall 11, a second wall 12, a third wall 13, a fourth wall 14, and a fifth wall 15. In the present embodiment, the casing body 10 is a cast product made of aluminum alloy in which the first wall 11, the second wall 12, the third wall 13, the fourth wall 14, and the fifth wall 15 are integrally provided. The casing body 10 having the configuration and shape as described above can be easily manufactured at a high productively.

The casing body 10 is not limited to the cast product made of aluminum alloy described above and may be a cast product such as a cast iron product or other metal cast products. The casing body 10 is not limited to a cast metal product and may be a product made of another material such as, for example, an injection-molded product made of a synthetic resin material. Further, the casing body 10 may have a configuration in which the first wall 11, the second wall 12, the third wall 13, the fourth wall 14, and the fifth wall 15 are formed separately from one another and integrally connected to one another by means such as welding, bonding, fastening, or the like.

The first wall 11 includes a first side 11a and a second side 11b parallel to each other. The first wall 11 also includes a third side 11c and a fourth side 11d that are orthogonal to the first side 11a and the second side 11b and parallel to each other. As described above, the first wall 11 has a rectangular plate-like shape in appearance formed by the four sides 11a to 11d. In the present embodiment, the first wall 11 constitutes a rear surface of the casing body 10.

The second wall 12 has an elongated rectangular plate-like shape and is continuous at a right angle to the first wall 11 on the first side 11a. The third wall 13 has an elongated rectangular plate-like shape in a manner similar to the second wall 12 and is continuous at a right angle to the first wall 11 on the second side 11b in a manner opposing the second wall 12. In the present embodiment, the second wall 12 and the third wall 13 oppose each other in parallel and constitute respective side surfaces facing left and right sides of the casing body 10.

The fourth wall 14 has an elongated plate-like shape and is continuous at a right angle to the third side 11c of the first wall 11 and, simultaneously, to upper sides of the second wall 12 and the third wall 13 located on the upper side in FIG. 3. The fourth wall 14 has a shape having a trapezoidal protruding portion that protrudes in a direction remote from the first wall 11 with respect to the second wall 12 and the third wall 13 and includes a surface of the protruding portion that is parallel to the first wall 11 and functions as an end surface 14a of the fourth wall 14 facing opposite from the first wall 11. In the present embodiment, the fourth wall 14 constitutes a top surface of the casing body 10 that faces up.

The fifth wall 15 has an elongated plate-like shape having a trapezoidal protruding portion in a manner similar to the fourth wall 14 and is continuous at a right angle to the fourth side 11d of the first wall 11 in a manner opposing the fourth wall 14 and also to bottom sides of the second wall 12 and the third wall 13 located on a lower side in FIG. 3. A surface of the protruding portion of the fifth wall 15 parallel to the surface of the first wall 11 functions as an end surface 15a facing opposite from the first wall 11. In the present embodiment, the fifth wall 15 constitutes a bottom surface of the casing body 10 that faces down.

Figure 4:
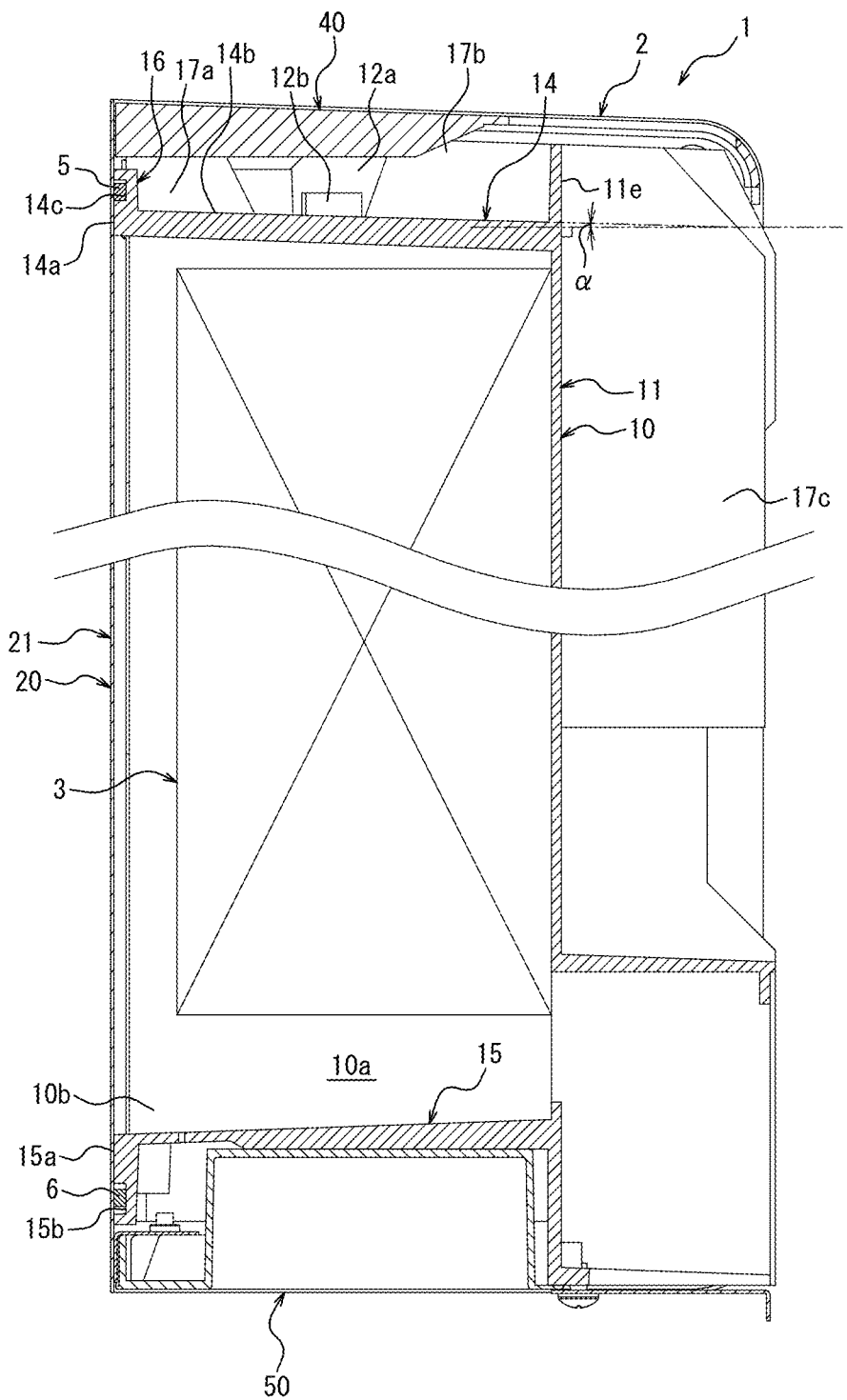
FIG. 4 is a vertical cross-sectional view of portions of the power control apparatus illustrated in FIG. 1 on a fourth wall side and a fifth wall side.

As illustrated in FIG. 4, the casing body 10 includes a housing space 10a therein in which the electrical apparatus 3 is housed. A side of the casing body 10 opposing the first wall 11 forms an opening 10b. By removing the cover body 20 from the casing body 10 and communicating the opening 10b to the outside, the electrical apparatus 3 can be arranged in the housing space 10a through the opening 10b.

Figure 5:
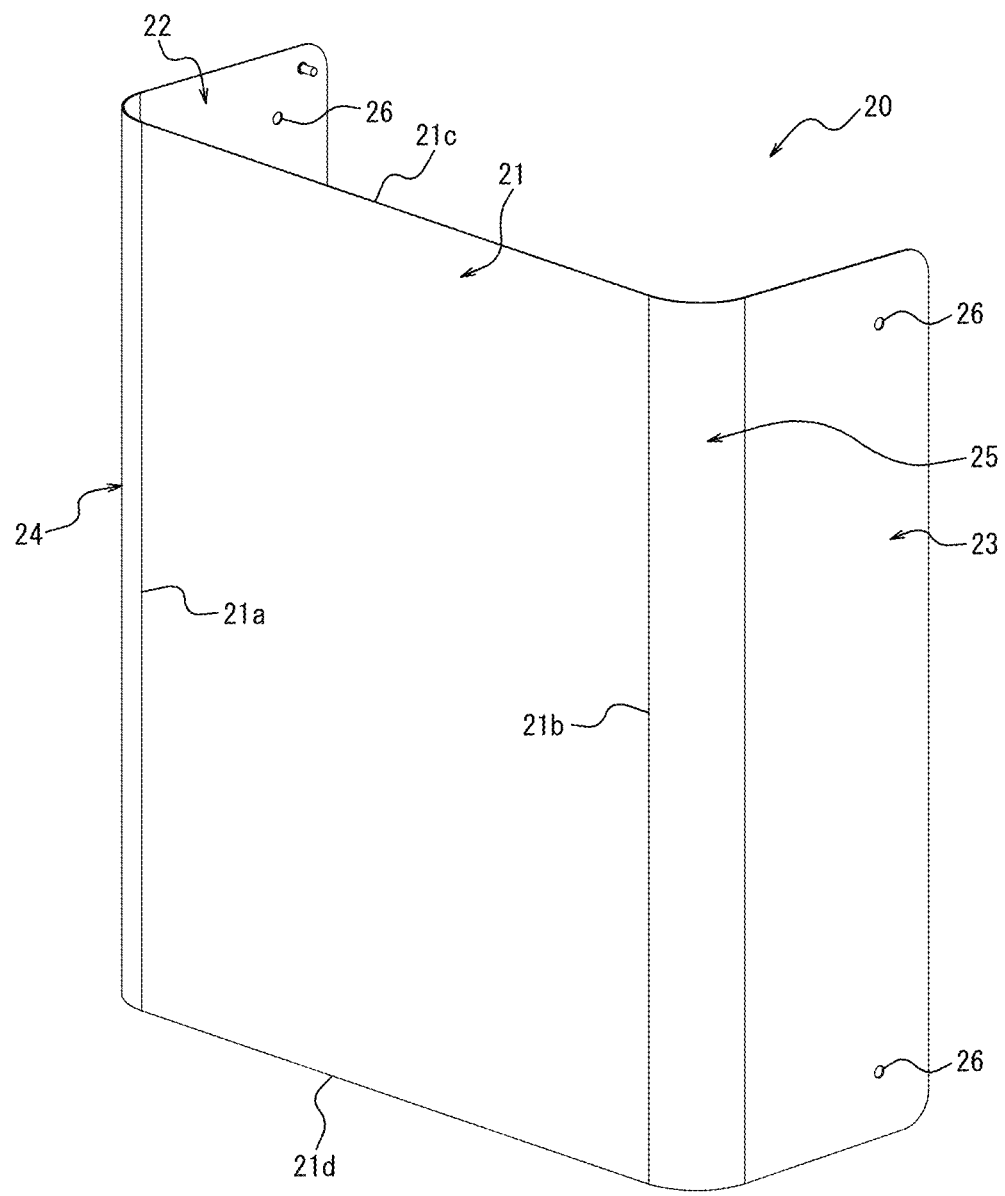
FIG. 5 is a perspective view of a cover body illustrated in FIG. 2.

As illustrated in FIG. 5, the cover body 20 has a U-shape in cross-section including a flat plate-like cover portion 21, a first side surface cover portion 22 that covers the second wall 12, a second side surface cover portion 23 that covers the third wall 13, a first curved cover portion 24 continuous to the flat plate-like cover portion 21 and the first side surface cover portion 22, and a second curved cover portion 25 continuous to the flat plate-like cover portion 21 and the second side surface cover portion 23.

The cover body 20 is formed by, for example, performing sheet metal processing of a metal plate made of steel, aluminum alloy, or stainless steel. Thus, the cover body 20 having the above shape can be formed easily at low cost by a simple bending process. A plate thickness of the cover body 20 can be determined appropriately and may preferably be, for example, 0.3 mm to 3.5 mm.

The cover body 20 is not limited to one formed by performing sheet metal processing of a plate material and may have a structure in which the flat plate-like cover portion 21, the first side surface cover portion 22, the second side surface cover portion 23, the first curved cover portion 24, and the second curved cover portion 25 are formed separately and integrally connected to one another by means such as welding, adhesion, or fastening. Further, the cover body 20 is not limited to a metal product and may be a product made of another material such as an injection molded product made of a synthetic resin material.

The flat plate-like cover portion 21 has a first side 21a and a second side 21b that are parallel to the first side of the first wall 11 of the casing body 10. The flat plate-like cover portion 21 also has a third side 21c and a fourth side 21d that are parallel to the third side 11c of the first wall 11. Thus, the flat plate-like cover portion 21 has an exterior in a rectangular plate-like shape including the four sides 21a to 21d. In the present embodiment, the flat plate-like cover portion 21 constitutes a front cover portion that covers the opening 10b formed on the front surface of the casing body 10.

The first curved cover portion 24 is integrally provided to the first side 21a of the flat plate-like cover portion 21. The first curved cover portion 24 is curved at an angle of 90 degrees in an arc about a central axis parallel to the first side 21a from the first side 21a toward the first wall 11.

The second curved cover portion 25 is integrally provided to the second side 21b of the flat plate-like cover portion 21. The second curved cover portion 25 is curved at an angle of 90 degrees in an arc about a central axis parallel to the second side 21b from the second side 21b toward the first wall 11.

The first side surface cover portion 22 has a rectangular plate-like shape parallel to the second wall 12 and is integrally provided to the first curved cover portion 24. Similarly, the second side surface cover portion 23 has a rectangular plate-like shape parallel to the third wall 13 and is integrally provided to the second curved cover portion 25.

Each of the first side surface cover portion 22 and the second side surface cover portion 23 is provided with two attaching holes 26 (note: one attaching hole 26 of the first side surface cover portion 22 is illustrated in the figure). On the other hand, each of the second wall 12 and the third wall 13 of the casing body 10 is provided with two screw holes 18 at locations on a side of the first wall 11 and close to the fourth wall 14 and the fifth wall 15, as illustrated in FIG. 3. As illustrated in FIG. 1, the cover body 20 is attached to the casing body 10 by screws 4 inserted into the attaching holes 26 of the cover body 20 and the corresponding screw holes 18 of the casing body 10. The cover body 20 attached to the casing body 10 covers the opening 10b of the casing body 10.

As described above, because the cover body 20 has the first curved cover portion 24 and the second curved cover portion 25, the cover body 20 has rounded corners and a good appearance. As a result, the casing 2 for an electrical apparatus that includes the cover body 20 having the above shape and the power control apparatus 1 can have a better (aesthetic) design than a casing in which the cover body 20 does not have the first curved cover portion 24 and the second curved cover portion 25.

Respective radii of the first curved cover portion 24 and the second curved cover portion 25 that are curved in an arc may be, for example, 10 mm or more. This configuration can enable the shape with rounded corners formed by the first curved cover portion 24 and the second curved cover portion 25 to sufficiently impress a viewer. Thus, the cover body 20 and the power control apparatus 1 using the cover body 20 can have an improved (aesthetic) design.

Preferably, the respective radii of the first curved cover portion 24 and the second curved cover portion 25 that are curved in an arc are, for example, in a range of 20 to 80 mm. This configuration can enable the shape with the rounded corners formed by the first curved cover portion 24 and the second curved cover portion 25 to sufficiently impress a viewer. Thus, the cover body 20 and the power control apparatus 1 using the cover body 20 can have an improved (aesthetic) design.

In the present embodiment, because the cover body 20 has the U-shape in cross section including the flat plate-like cover portion 21, the first side surface cover portion 22, the second side surface cover portion 23, the first curved cover portion 24, and the second curved cover portion 25, the cover body 20 has rounded corners across the flat plate-like cover portion 21 and thus an improved exterior. As a result, the cover body 20 having the above shape and the power control apparatus 1 using the cover body 20 can have a better (aesthetic) design than a cover body that does not have curved cover portions.

In the present embodiment, further, the first side surface cover portion 22 and the second side surface cover portion 23 cover the second wall 12 and the third wall 13 of the casing body 10. This configuration can suppress the second wall 12 and the third wall 13 of the casing body 10 heated by heat generated by the electrical apparatus 3 from being directly touched by hands.

The fourth wall 14 of the casing body 10 is provided with a flashing portion 16, as illustrated in FIG. 3 and FIG. 4. The flashing portion 16 is formed as a wall that extends along the end surface 14a of the fourth wall 14 facing opposite from the first wall 11 and protrudes in a direction remote from the fifth wall 15 (upward in FIG. 4) with respect to a surface 14b of the fourth wall 14 facing outside of the casing body 10. The flashing portion 16 is integrally provided to the fourth wall 14 and a surface of the flashing portion 16 facing opposite from the first wall 11 constitutes the end surface 14a of the fourth wall 14.

In a case in which the power control apparatus 1 is installed such that the surface 14b of the fourth wall 14 faces up and an extension direction of the first wall 11 is parallel to the vertical direction, the flashing portion 16 protrudes upward from the surface 14b serving as the top surface of the casing body 10 and thus can suppress water such as rainwater accumulated on the surface 14b from flowing toward the end surface 14a.

As illustrated in FIG. 4, the surface 14b of the fourth wall 14 facing the outside of the casing body 10 is inclined in a manner gradually approaching the fifth wall 15 from a side of the flat plate-like cover portion 21 of the cover body 20 (a side of the end surface 14a of the fourth wall 14) toward the first wall 11. As a result, in a case in which the power control apparatus 1 is installed such that the surface 14b of the fourth wall 14 faces up and the extension direction of the first wall 11 is parallel to the vertical direction, water such as rainwater accumulated on the surface 14b serving as the top surface of the casing body 10 can flow down the inclination in a direction remote from the end surface 14a of the fourth wall 14.

An inclination angle α of the surface 14b can be set to an appropriate value. For example, the inclination angle α of the surface 14b can be set to an angle between 1 degree and 35 degrees with respect to a direction perpendicular to the extension direction of the first wall 11. Such an angle enables effective flow of water such as rainwater in the direction remote from the end surface 14a of the fourth wall 14 without increasing a size of the casing body 10 due to the inclined surface 14b.

The casing body 10 may also have a configuration in which a heat sink 17 is integrally provided to the surface 14b of the fourth wall 14 facing the outside of the casing body 10. In the present embodiment, the heat sink 17 includes first heat sink portions 17a integrally provided to the flashing portion 16. A partition wall portion 11e protruding from the surface 14b in a direction remote from the fifth wall 15 is integrally provided to the first wall 11, and the heat sink 17 includes second heat sink portions 17b that are arranged being spaced apart from the first heat sink portion 17a and integrally provided to the partition wall portion 11e. Further, the heat sink 17 includes third heat sink portions 17c integrally provided to the partition wall portion 11e and an outer side surface of the first wall 11. A plurality of the first heat sink portions 17a, the second heat sink portions 17b, and the third heat sink portions 17c are arranged side by side between the second wall 12 and the third wall 13. Because the casing body 10 includes the heat sink 17 integrally provided thereto, the casing body 10 can effectively discharge heat generated by the electrical apparatus 3 housed in the housing space 10a to the outside.

As illustrated in FIG. 3 and FIG. 4, the second wall 12 and the third wall 13 are integrally provided to respective partition wall portions 12a and 13a that protrude from the surface 14b in the direction remote from the fifth wall 15. The partition wall portions 12a and 13a are provided with respective rectangular through holes 12b and 13b penetrating the partition wall portions 12a and 13a having respective one edge continuous to the surface 14b. The through holes 12*b* and 13*b* are continuous to the entire area of the surface 14*b* via a portion between the first heat sink portion 17*a* and the second heat sink portion 17*b* on the surface 14*b* of the fourth wall 14. Thus, when water such as rainwater is accumulated on the surface 14*b* in a case in which the power control apparatus 1 is installed such that the fourth wall 14 of the casing body 10 faces up, the water can be discharged to outside of the second wall 12 or the third wall 13 through the through holes 12*b* and 13*b*.

A plurality (two in the drawing) of vertical ribs 13*c* extending in a direction parallel to the first side 11*a* and the second side 11*b* and a plurality (five in the drawing) of horizontal ribs 13*d* orthogonal to the vertical ribs 13*c* may be provided on the outer surfaces of the second wall 12 and the third wall 13 facing the outside of the casing body 10. Although the vertical ribs and horizontal ribs provided on the outer surface of the second wall 12 are not illustrated in FIG. 3, the vertical ribs and the horizontal ribs respectively similar to the vertical ribs 13*c* and the horizontal ribs 13*d* provided on the outer surface of the third wall 13 are provided on the outer surface of the second wall 12. As a result, the second wall 12 and the third wall 13 can be made thinner and lighter while increasing the rigidity, and heat generated by the electrical apparatus 3 housed in the housing space 10*a* can be effectively dissipated through the second wall 12 and the third wall 13.

A first sealing member 5 and a second sealing member 6 are provided between the casing body 10 and the flat plate-like cover portion 21 of the cover body 20, as illustrated in FIG. 4. Both the first sealing member 5 and the second sealing member 6 have a waterproof function of sealing between the casing body 10 and the flat plate-like cover portion 21 to a degree to stop water such as rainwater from entering.

The end surface 14*a* of the fourth wall 14 is provided with a groove-shaped portion 14*c* that is recessed in a U-shape toward the first wall 11 and extends straight in parallel with the third side 11*c*. In the present embodiment, the groove-shaped portion 14*c* is provided to the flashing portion 16. A bottom surface of the groove-shaped portion 14*c* facing opposite from the first wall 11 constitutes a part of the end surface 14*a* of the fourth wall 14.

The first sealing member 5 is formed in the shape of a rod having a rectangular cross-section and a length similar to that of the first side 21*a* of the flat plate-like cover portion 21. As illustrated in FIG. 3, the first sealing member 5 is arranged within the groove-shaped portion 14*c* in a manner extending parallel to the first side 21*a* of the flat plate-like cover portion 21. In a state in which the cover body 20 is attached to the casing body 10 as illustrated in FIG. 4, the first sealing member 5 is tucked between the bottom surface of the groove-shaped portion 14*c* constituting a part of the end surface 14*a* of the fourth wall 14 of the casing body 10 and a portion of the flat plate-like cover portion 21 of the cover body 20 on a side of the first side 21*a*. As a result, the first sealing member 5 is elastically deformed at a predetermined ratio in a compression direction and seals between the end surface 14*a* of the fourth wall 14 and the flat plate-like cover portion 21.

The end surface 15*a* of the fifth wall 15 is provided with a groove-shaped portion 15*b* that is recessed in a U-shape toward the first wall 11 and extends straight in parallel with the fourth side 11*d*. A bottom surface of the groove-shaped portion 15*b* facing opposite from the first wall 11 constitutes a part of the end surface 15*a* of the fifth wall 15.

The second sealing member 6 is formed in the shape of a rod having a rectangular cross section and a length similar to that of the second side 21*b* of the flat plate-like cover portion 21. As illustrated in FIG. 3, the second sealing member 6 is arranged within the groove-shaped portion 15*b* in a manner extending parallel to the second side 21*b* of the flat plate-like cover portion 21. As illustrated in FIG. 4, in a state in which the cover body 20 is attached to the casing body 10, the second sealing member 6 is tucked between the bottom surface of the groove-shaped portion 15*b* constituting a part of the end surface 15*a* of the fifth wall 15 of the casing body 10 and a portion of the flat plate-like cover portion 21 of the cover body 20 on a side of the first side 21*b*. As a result, the second sealing member 6 is elastically deformed at a predetermined ratio in a compression direction and seals between the end surface 15*a* of the fifth wall 15 and the flat plate-like cover portion 21.

As described above, by providing the second sealing member 6 between the end surface 15*a* of the fifth wall 15 of the casing body 10 and the flat plate-like cover portion 21 of the cover body 20, water such as rainwater can be suppressed from entering the housing space 10*a* inside the casing body 10 from between the end surface 15*a* of the fifth wall 15 of the casing body 10 and the flat plate-like cover portion 21 of the cover body 20.

The first sealing member 5 and the second sealing member 6 described above may be formed from an elastic body made of synthetic rubber or elastomer. The first sealing member 5 and the second sealing member 6 may be formed from a rubber sponge which is a foam of ethylene propylene rubber. The first sealing member 5 and the second sealing member 6 may have a structure and material other than those described above.

Although in the present embodiment the first sealing member 5 and the second sealing member 6 are respectively arranged in the groove-shaped portions 14*c* and 15*b* that are respectively formed on the end surfaces 14*a* and 15*a*, the groove-shaped portions 14*c* and 15*b* do not need to be formed on the end surfaces 14*a* and 15*a*, and the first sealing member 5 and the second sealing member 6 may be respectively arranged between the end surface 14*a* and the flat plate-like cover portion 21 and between the end surface 15*a* and the flat plate-like cover portion 21. Further, the respective cross-sectional shapes of the first sealing member 5 and the second sealing member 6 are not limited to the rectangle shapes and may be another shape such as a circular shape.

Figure 6:
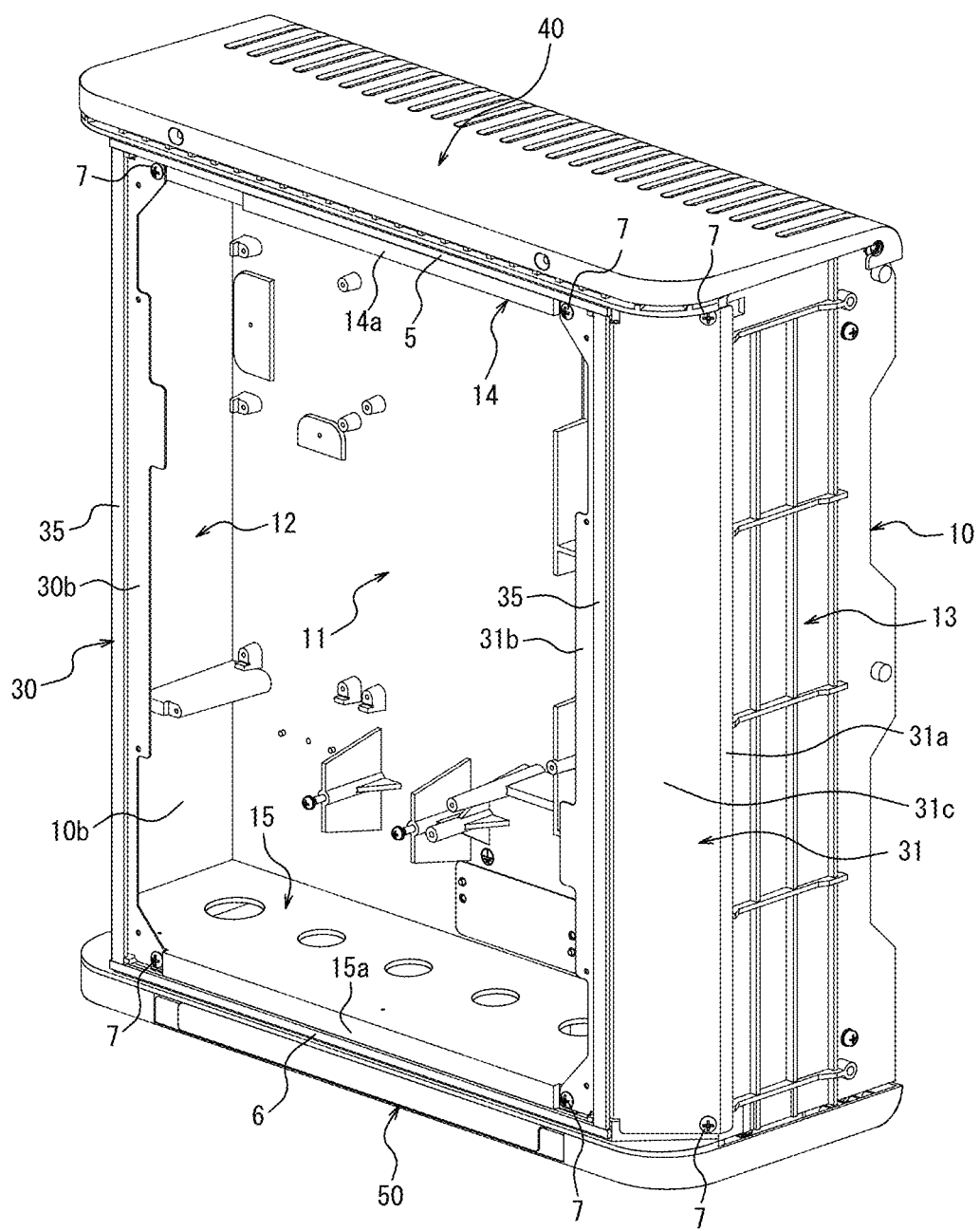
FIG. 6 is a perspective view of the power control apparatus illustrated in FIG. 1 in a state in which the cover body and an electrical apparatus are removed.

As illustrated in FIG. 6, the casing body 10 is provided with a first partition wall 30 and a second partition wall 31. In the present embodiment, each of the first partition wall 30 and the second partition wall 31 is formed separately from the casing body 10 and the cover body 20 and fixedly attached the casing body 10 by screws 7.

The first partition wall 30 is arranged on an end surface of the second wall 12 of the casing body 10 facing opposite from of the first wall 11, in a manner continuous thereto. The first partition wall 30 is formed in a wall shape that is inclined with respect to the second wall 12 extending between the flat plate-like cover portion 21 of the cover body 20 and the first side surface cover portion 22.

The second partition wall 31 is arranged on an end surface of the third wall 13 of the casing body 10 facing opposite from the first wall 11, in a manner continuous thereto. The second partition wall 31 is formed in a wall shape that is inclined with respect to the third wall 13 extending between the flat plate-like cover portion 21 of the cover body 20 and the second side surface cover portion 23.

Because the first partition wall 30 and the second partition wall 31 basically have the same shapes and attachment structures with respect to the casing body 10, the second partition wall 31 will be described hereinafter.

Figure 7:
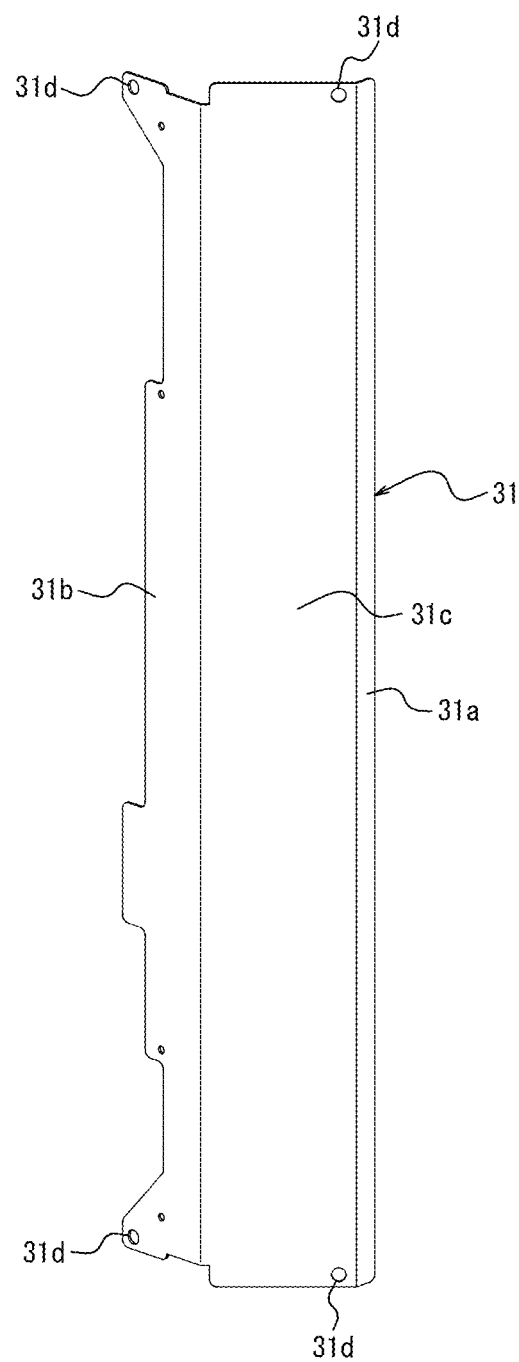
FIG. 7 is a perspective view of a partition wall illustrated in FIG. 6.

As illustrated in FIG. 7, the second partition wall 31 includes a flat plate-like first surface portion 31a parallel to the third wall 13, a flat plate-like second surface portion 31b parallel to the first wall 11, and a third surface portion 31c that is formed in a flat plate-like shape inclined with respect to both the first surface portion 31a and the second surface portion 31b and integrally provided between the first surface portion 31a and the second surface portion 31b. Each of the second surface portion 31b and the third surface portion 31c is provided with two (four in total) through holes 31d through which the screws 7 are to be inserted.

Each of the first partition wall 30 and the second partition wall 31 is formed by performing sheet metal processing of a metal plate material made of steel, aluminum alloy, or stainless steel. Thus, the first partition wall 30 and the second partition wall 31 having the above shape can be formed easily at low cost. The first partition wall 30 and the second partition wall 31 are not limited to those formed by performing the sheet metal processing of the metal plate material and may be formed from other materials such as injection-molded product made of a synthetic resin material or by other methods.

The third surface portion 31c of the second partition wall 31 has a length corresponding to a distance between the fourth wall 14 and the fifth wall 15, one longitudinal end that opposes an inclined surface between the end portion 14a of the trapezoidal protruding portion of the fourth wall 14 and the third wall 13 and the other longitudinal end that opposes an inclined surface between the end surface 15a of the trapezoidal protruding portion of the fifth wall 15 and the third wall 13. Also, the second surface portion 31b has one end that opposes a part of the end surface 14a of the fourth wall 14 and the other end that opposes a part of the end surface 15a of the fifth wall 15. Further, the first surface portion 31a opposes an end portion of the surface of the third wall 13 facing opposite from the second wall 12. By attaching the first partition wall 30 and the second partition wall 31 having the above configurations to the casing body 10, the opening 10b of the casing body 10 is defined by the end surface 14a of the fourth wall 14, the end surface 15a of the fifth wall 15, the first partition wall 30, and the second partition wall 31. Because second surface 30b of the first partition wall 30 and the second surface 31b of the second partition wall 31 are arranged in a manner to be respectively offset from the second wall 12 toward the third wall 13 and from the third wall 13 toward the second wall 12, a width of the opening 10b defined by the end surface 14a of the fourth wall 14, the end surface 15a of the fifth wall 15, the first partition wall 30, and the second partition wall 31 in a direction directing from the second wall 12 to the third wall 13 is narrower than a distance between the second wall 12 and the third wall 13.

In the present embodiment, the first partition wall 30 and the second partition wall 31 are formed separately from the casing body 10 and the cover body 20 and attached to the casing body 10. Thus, to arrange the electrical apparatus 3 in the housing space 10a within the casing body 10 via the opening 10b, by removing the first partition wall 30 and the second partition wall 31 from the casing body 10, the opening 10b can be enlarged to a size corresponding to the distance between the second wall 12 and the third wall 13. As a result, arrangement of the electrical apparatus 3 in the housing space 10a of the casing body 10 is facilitated.

Figure 8:
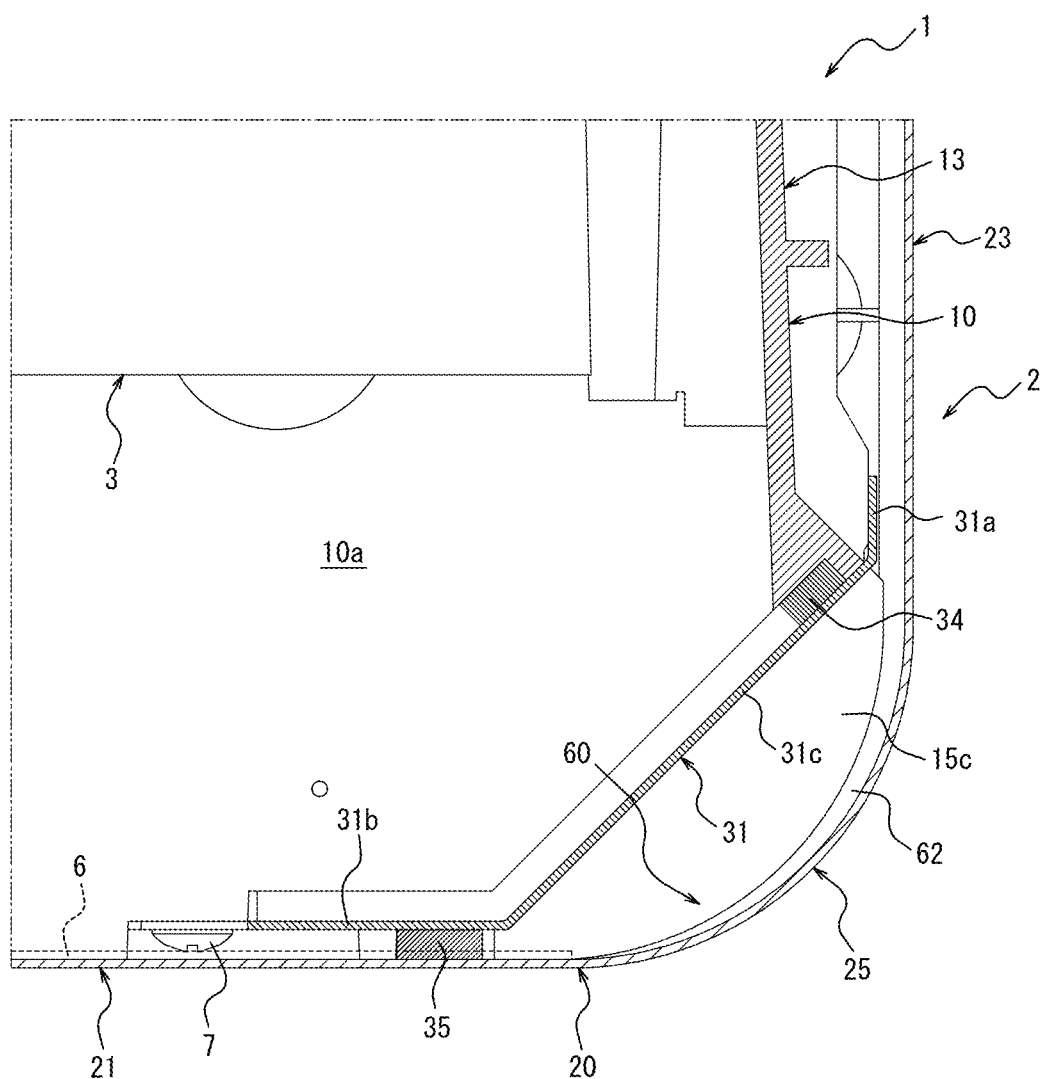
FIG. 8 is a cross-sectional view illustrating a communication portion provided inside a curved cover portion.

As illustrated in FIG. 3, first auxiliary sealing members 32 extending over the end surface 14a and the inclined surface of the trapezoidal protruding portion are arranged on the fourth wall 14. The first auxiliary sealing members 32 are tucked between the second surface portion 31b of the second partition wall 31 and the end surface 14a of the fourth wall 14 and also between the third surface portion 31c of the second partition wall 31 and the inclined surface of the protruding portion and thus has a waterproof function to a degree that stops water from entering between them. Also, second auxiliary sealing members 33 extending over the end surface 15a and the inclined surface of the trapezoidal protruding portion are arranged on the fifth wall 15. The second auxiliary sealing members 33 are tucked between the second surface portion 31b of the second partition wall 31 and the end surface 15a of the fifth wall 15 and also between the third surface portion 31c of the second partition wall 31 and the inclined surface of the protruding portion and has a waterproof function to a degree that stops water from entering between them. Further, third auxiliary sealing members 34 are arranged on the end surface of the third wall 13 facing opposite from the first wall 11. As illustrated in FIG. 8, the third auxiliary sealing members 34 are tucked between the third surface portion 31c of the second partition wall 31 and the end surface of the third wall 13 facing opposite from the first wall 11 and has a waterproof function to a degree that stops water from entering between them. As described above, the space between the second partition wall 31 and the casing body 10 is sealed by the first auxiliary sealing members 32, the second auxiliary sealing members 33, and the third auxiliary sealing members 34. Thus, water such as rainwater is suppressed from entering the inside (the housing space 10a) of the casing body 10 from between the second partition wall 31 and the casing body 10.

A partition wall sealing member 35 is arranged between the second surface portion 31b of the second partition wall 31 and the flat plate-like cover portion 21 of the cover body 20, as illustrated in FIG. 8. The partition wall sealing member 35 is formed in a rod shape extending along the longitudinal direction of the second surface portion 31b of the second partition wall 31, as illustrated in FIG. 6. The partition wall sealing members 35 has one end in the longitudinal direction that is connected to one end of the first sealing member 5 in a manner being abutted against the one end and also has the other end in the longitudinal direction that is connected to one end of the second sealing member 6 in a manner being abutted against the one end. The partition wall sealing member 35 is tucked between the second surface portion 31b and the flat plate-like cover portion 21 of the cover body 20 and has a waterproof function to a degree that stops water from entering between them.

As described above, the first sealing member 5, the second sealing member 6, and two partition wall sealing members 35 are arranged between the opening 10b of the casing body 10 and the flat plate-like cover portion 21 of the cover body 20 that covers the opening 10b, in a manner surrounding the opening 10b. Thus, water such as rainwater can be further suppressed from entering the casing body 10 from the opening.

As illustrated in FIG. 8, a communication portion 60 is arranged inside the first curved cover portion 24 of the cover body 20. Similarly, a communication portion 60 is also arranged inside the second curved cover portion 25. The communication portion 60 arranged inside the first curved cover portion 24 and the communication portion 60 arranged inside the second curved cover portion 25 have basically the same configuration, other than being symmetrical. Thus, the communication portion 60 arranged inside the second curved cover portion 25 will be described hereinafter.

Figure 9:
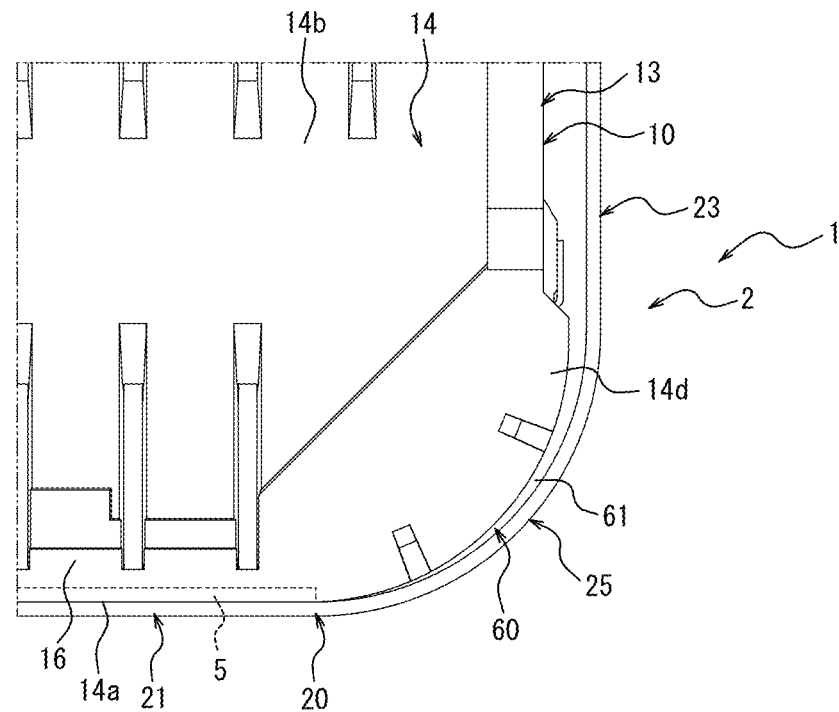
FIG. 9 is a plan view illustrating a communication structure of the communication portion for communicating with an outside on the fourth wall side of the casing body.
Figure 10:
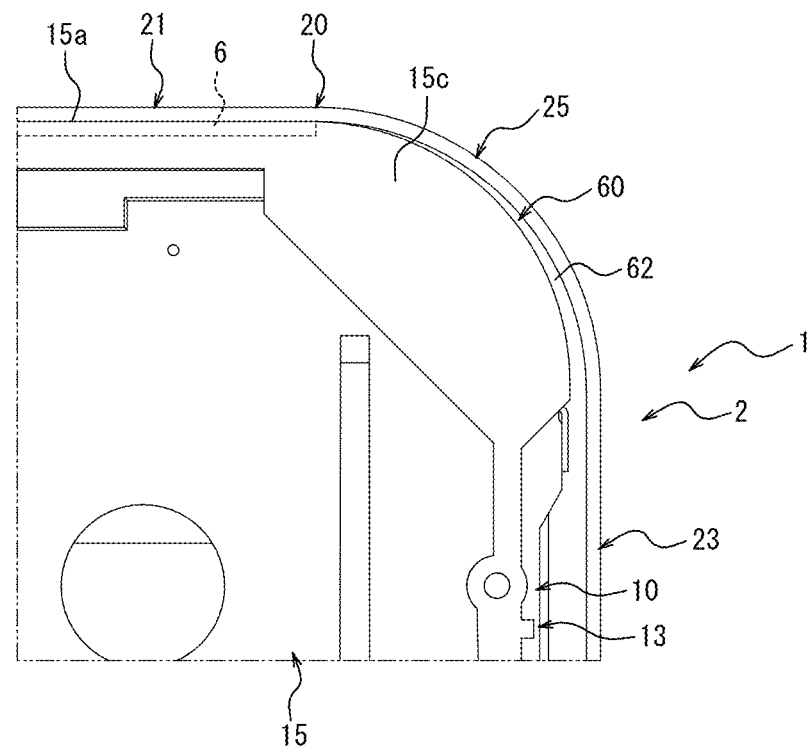
FIG. 10 is a bottom view illustrating a communication structure of the communication portion for communicating with the outside on the fifth wall side of the casing body.

The communication portion 60 is configured as a space extending in a direction along the second side 21b of the flat plate-like cover portion 21 inside the second curved cover portion 25. As illustrated in FIG. 9, one end of the communication portion 60 on a side of the fourth wall 14 communicates with the outside of the casing 2 for an electrical apparatus in a gap 61 between an inner peripheral surface of the second curved cover portion 25 and the fourth wall 14 of the casing body 10. As illustrated in FIG. 10, also, the other end of the communication portion 60 on a side of the fifth wall 15 communicates with the outside of the casing 2 for an electrical apparatus in a gap 62 between the inner peripheral surface of the second curved cover portion 25 and the fifth wall 15 of the casing body 10. As described above, the communication portion 60 is formed to be a space that penetrates the casing 2 for an electrical apparatus from the side of the fourth wall 14 toward the side of the fifth wall 15 in a portion of the second curved cover portion 25.

In the present embodiment, as illustrated in FIG. 9, a flange portion 14d having an arcuate outer peripheral surface is integrally provided between the end surface 14a of the fourth wall 14 and the third wall 13, and the gap 61 is provided between an outer peripheral surface of the flange portion 14d and the inner peripheral surface of the second curved cover portion 25. A radius of the arcuate outer peripheral surface of the flange portion 14d is smaller than a radius of the second curved cover portion 25. As a result, the gap 61 has a shape in which a distance between the outer peripheral surface of the flange portion 14d and the inner peripheral surface of the second curved cover portion 25 gradually increases from a side of the end surface 14a.

In the present embodiment, as illustrated in FIG. 10, a flange portion 15c having an arcuate outer peripheral surface is integrally provided between the end surface 15a of the fifth wall 15 and the third wall 13, and the gap 62 is provided between the outer peripheral surface of the collar portion 15c and the inner peripheral surface of the second curved cover portion 25. A radius of the arcuate outer peripheral surface of the flange portion 15c is smaller than a radius of the second curved cover portion 25. As a result, the gap 62 has a shape in which a distance between the outer peripheral surface of the flange portion 15c and the inner peripheral surface of the second curved cover portion 25 gradually increases from a side of the end surface 15a.

The communication portion 60 can function as a drainage channel extending in an up-down direction in a case in which the power control apparatus 1 is installed such that the surface 14b of the fourth wall 14 of the casing body 10 faces up.

As illustrated in FIG. 1, the power control apparatus 1 of the present embodiment having the above configuration is installed outdoors such that the surface 14b of the fourth wall 14 of the casing body 10 faces up. At this time, the power control apparatus 1 is installed such that the first wall 11 of the casing body 10 opposes the exterior wall of the house or the like. A wiring extending from the electrical apparatus 3 toward the electric power system inside the house and the solar cell is pulled out to the outside of the casing 2 for an electrical apparatus through holes formed on the fifth wall 15 and the bottom cover 50 of the casing body 10 that faces down.

In a case in which the power control apparatus 1 is installed outdoors such that the surface 14b of the fourth wall 14 faces up, there is a risk that water such as rainwater is accumulated on the surface 14b.

However, in the power control apparatus 1 of the present embodiment, the casing 2 for an electrical apparatus includes the first sealing member 5 arranged between the end surface 14a of the fourth wall 14 of the casing body 10 and the flat plate-like cover portion 21 of the cover body 20 and thus can suppress water such as rainwater from entering between the end surface 14a of the fourth wall 14 of the casing body 10 and the flat plate-like cover portion 21 of the cover body 20. Especially in a case in which the power control apparatus 1 is installed such that the surface 14b of the fourth wall 14 of the casing body 10 faces up, water such as rainwater may be accumulated on the surface 14b. However, water such as rainwater accumulated on the surface 14b can be suppressed from entering the inside (the housing space 10a) of the casing body 10 from between the end surface 14a of the fourth wall 14 of the casing body 10 and the flat plate-like cover portion 21 of the cover body 20.

On the other hand, there may be a risk that, in spite of the first sealing member 5 provided between the end surface 14a and the flat plate-like cover portion 21, water may remain accumulated between the end surface 14a and the flat plate-like cover portion 21.

However, the casing 2 for an electrical apparatus of the present embodiment includes, on the inner sides of the first curved cover portion 24 and the second curved cover portion 25 that are continuous to the flat plate-like cover portion 21, the communication portions 60 that extend in the direction along the side 21a and 21b of the flat plate-like cover portion 21 and communicate with the outside between the first curved cover portion 24 and the casing body 10 and between the second curved cover portion 25 and the casing body 10. As a result, water accumulated between the end surface 14a and the flat plate-like cover portion 21 can be guided into the communication portion 60 from the gap 61 between the first curved cover portion 24, the second curved cover portion 25, and the flange portion 14d of the fourth wall 14 of the casing body 10 and can then flow downward along the communication portion 60 that functions as the drainage channel. Further, water flowing downward along the communication portion 60 can be discharged outside from the gap 62 located between the first curved cover portion 24, the second curved cover portion 25, and the flange portion 15c of the fifth wall 15 of the casing body 10. Thus, water accumulated between the end surface 14a and the flat plate-like cover portion 21 can be suppressed from entering the inside of the casing body 10 due to a capillary phenomenon or the like, and the waterproof property of the casing 2 for an electrical apparatus can be improved.

In the present embodiment, further, the flange portion 14d having the arcuate outer peripheral surface is provided on the fourth wall 14 such that the gaps 61 between the first curved cover portion 24 and the fourth wall 14 and between the second curved cover portion 25 and the fourth wall 14 have respective elongated slit shapes extending along the inner peripheral surfaces of the first curved cover portion 24 and the second curved cover portion 25. As a result, water guided into the communication portion 60 from the gap 61 can flow along the inner peripheral surfaces of the first curved cover portion 24 and the second curved cover portion 25, whereby the waterproof property of the casing 2 for an electrical apparatus can be further improved.

Here, in addition to the first sealing member 5 that seals the gap between the end surface 14a and the flat plate-like cover portion 21, waterproof seals may be tucked between the first curved cover portion 24 and the flange portion 14d of the fourth wall 14 of the casing body 10 and between the second curved cover portion 25 and the flange portion 14d of the fourth wall 14 of the casing body 10 to seal between them. In this case, however, when the cover body 20 is fitted to the casing body 10, each part of the waterproof seals is compressed in a direction directed from the flat plate-like cover portion 21 toward the end surface 14a while being not compressed in a direction perpendicular to the inner peripheral surfaces of the first curved cover portion 24 and the second curved cover portion 25. As a result, there is a risk that compression ratios of the respective parts of the waterproof seals become uneven, causing wrinkles or the like in a portion under an insufficient compression and exhibiting insufficient waterproof property.

On the other hand, in the casing 2 for an electrical apparatus of the present embodiment, waterproof seals are not provided between the first curved cover portion 24 and the flange portion 14d of the fourth wall 14 of the casing body 10 and between the second curved cover portion 25 and the flange portion 14d of the fourth wall 14 of the casing body 10, and water accumulated between the end surface 14a and the flat plate-like cover portion 21 is actively discharged to the outside through the communication portion 60. Thus, the waterproof property of the casing 2 for an electrical apparatus can be improved.

The configuration described above can ensure the waterproof functions of the casing 2 for an electrical apparatus and the power control apparatus 1 and, by providing the first curved cover portion 24 and the second curved cover portion 25 to the cover body 20, the (aesthetic) design of the casing 2 for an electrical apparatus and the power control apparatus 1 can be improved.

In the casing 2 for an electrical apparatus of the present embodiment, on the other hand, the first sealing member 5 is provided between the end surface 14a of the casing body 10 and the flat plate-like cover portion 21 of the cover body 20, and the second sealing member 6 is provided between and the end surface 15a of the casing body 10 and the flat plate-like cover portion 21 of the cover body 20. Further, the partition wall sealing members 35 are provided between the first partition wall 30 and the flat plate-like cover portion 21 and between the second partition wall 31 and the flat plate-like cover portion 21. As a result, the first sealing member 5, the second sealing member 6, and the partition wall sealing members 35 can be entirely compressed in the direction perpendicular to the first wall 11. Thus, the first sealing member 5, the second sealing member 6, and the partition wall sealing members 35 can be entirely compressed at a constant compressibility, and the opening 10b of the casing body 10 can be protected from water by the flat plate-like cover portion 21 of the cover body 20.

In the casing 2 for an electrical apparatus of the present embodiment, further, the first auxiliary sealing members 32, the second auxiliary sealing members 33, and the third auxiliary sealing members 32 are provided between the first partition wall 30 and the casing body 10 and between the second partition wall 31 and the casing body 10. All of the first auxiliary sealing members 32, the second auxiliary sealing members 33, and the third auxiliary sealing members 34 are tucked between the third surface portion 31c of the second partition wall and the surface of the casing body 10 parallel thereto and to be compressed. The same applies to the side of the first partition wall 30. In other words, the first auxiliary sealing members 32, the second auxiliary sealing members 33, and the third auxiliary sealing members 34 are respectively compressed in one direction in which they are entirely inclined with respect to the direction perpendicular to the first wall 11. Thus, the entire first auxiliary sealing members 32, the second auxiliary sealing members 33, and the third auxiliary sealing members 34 are compressed at a constant compression rate, whereby the gaps between the first partition wall 30 and the casing body 10 and between the second partition wall 31 and the casing body 10 can be further reliably sealed. Thus, water can be further reliably suppressed from entering from between the first partition wall 30 and the casing body 10 and between the second partition wall 31 and the casing body 10.

In the present embodiment, because the first partition wall 30 and the second partition wall 31 are provided to the casing body 10, the communication portion 60 can be separated from the inside (the housing space 10a) of the casing body 10 by the first partition wall 30 and the second partition wall 31. As a result, water such as rainwater flowing in the communication portion 60 can be suppressed from entering the inside of the casing body 10, whereby the waterproof properties of the casing 2 for an electrical apparatus and the power control apparatus 1 can be further improved.

In the present embodiment, the flashing portion 16 is provided on the fourth wall 14 of the casing body 10, as described above. In a case in which the power control apparatus 1 is installed such that the surface 14b of the fourth wall 14 faces up and the extension direction of the first wall 11 is parallel to the vertical direction, the flashing portion 16 protrudes upward from the surface 14b serving as the top surface of the casing body 10. Thus, water such as rainwater accumulated on the surface 14b is blocked by the flashing portion 16 and is suppressed from flowing toward the end surface 14a.

In the present embodiment, as described above, because the flashing portion 16 that extends along the end surface 14a and protrudes in the direction remote from the fifth wall 15 is provided to the fourth wall 14, in a case in which the power control apparatus 1 is installed such that the surface 14b of the fourth wall 14 faces up and the extension direction of the first wall 11 is parallel to the vertical direction, water such as rainwater accumulated on the surface 14b is suppressed from flowing toward the end surface 14a. As a result, water such as rainwater accumulated on the surface 14b is suppressed from reaching between the end surface 14a of the fourth wall 14 of the casing body 10 and the flat plate-like cover portion 21 of the cover body 20, whereby the waterproof properties of the casing 2 for an electrical apparatus and the power control apparatus 1 can be further improved.

In the present embodiment, further, the surface 14b of the fourth wall 14 facing the outside of the casing body 10 is inclined in the manner to gradually approach the fifth wall 15 from the side of the flat plate-like cover portion 21 of the cover body 20 (the side of the end surface 14a of the fourth wall 14) toward the side of the first wall 11, as described above. This configuration enables, in a case in which the power control apparatus 1 is installed such that the surface 14b of the fourth wall 14 faces up and the extension direction of the first wall 11 is parallel to the vertical direction, water such as rainwater accumulated on the surface 14b serving as the top surface of the casing body 10 to flow down the inclination in the direction remote from the end surface 14a of the fourth wall 14, and also the water to be discharged to the outside through the holes 12b and 13b before being accumulated and reaching the end surface 14a. Water discharged through the through holes 12b and 13b flows downward through between the second wall 12 of the casing body 10 and the first side surface cover portion 22 of the cover body 20 between the third wall 13 of the casing body 10 and the second side surface cover portion 23 of the cover body 20 and then is discharged to the outside from the bottom end of the casing body 10 or the cover body 20. As a result, water accumulated on the surface 14b can be further suppressed from reaching the end surface 14a, whereby the waterproof properties of the casing 2 for an electrical apparatus and the power control apparatus 1 can be further improved.

The top cover 40 is made of synthetic resin and attached to the casing body 10 to cover the end surface 14a of the fourth wall 14 facing the outside of the casing body 10 from above, as illustrated in FIG. 1. The top cover 40 is provided with a plurality of slit-shaped discharge holes 41 for discharging heat radiated through the heat sink 17 to the outside. Because the top cover 40 is attached to the casing body 10 as described above, the heat sink 17 or the surface 14b of the casing body 10 heated by heat from the electrical apparatus 3 can be suppressed from being directly touched by hand.

The bottom cover 50 is made of synthetic resin and attached to the casing body 10 to cover the bottom side of the fifth wall 15 as illustrated in FIG. 6. The bottom cover 50 can discharge water discharged from the gap 62 located on a bottom side of the communication portion 60 to the outside through the discharge holes formed at predetermined locations. Because the bottom cover 50 is attached to the casing body 10, the fifth wall 15 of the casing body 10 heated by heat from the electrical apparatus 3 can be suppressed from being directly touched by hand.

The present disclosure is not limited to the above embodiments and can be modified in various manners without departing from the gist thereof.

For example, although in the above embodiments the cover body 20 includes the first curved cover portion 24 and the second curved cover portion 25, the cover body 20 can include one curved cover portion alone. In this case, one partition wall alone corresponding to the one curved cover portion may be provided to the casing body 10.

Although in the above embodiments the cover body 20 includes the first side surface cover portion 22 and the second side surface cover portion 23, the first side surface cover portion 22 and the second side surface cover portion 23 can be omitted.

Although in the above embodiments the casing 2 for an electrical apparatus includes the first partition wall 30 and the second partition wall 31, the casing 2 for an electrical apparatus may omit the first partition wall 30 and the second partition wall 31. In this case, the communication portion 60 may be configured to function as a ventilation passage for a ventilation fan arranged in the housing space 10a of the casing body 10.

Although in the above embodiments the first partition wall 30 and the second partition wall 31 are formed separately from the casing body 10 and the cover body 20 and attached to the casing body 10, this is not restrictive. The first partition wall 30 and the second partition wall 31 may be integrally provided to the casing body 10. The first partition wall 30 and the second partition wall 31 may be formed separately from the casing body 10 and the cover body 20 and attached to the cover body 20. Further, the first partition wall 30 and the second partition wall 31 may be integrally provided to the cover body 20.

Although in the above embodiments the casing body 10 includes the flashing portion 16, the flashing portion 16 may be omitted.

Although in the above embodiments the surface 14b of the fourth wall 14 of the casing body 10 is inclined to gradually approach the fifth wall 15 from the side of the flat plate-like cover portion 21 toward the side of the first wall 11, this is not restrictive. The surface 14b does not need to be inclined.

In the above embodiments the first sealing member 5 is provided between the end surface 14a of the fourth wall 14 of the casing body 10 and the flat plate-like cover portion 21 of the cover body 20, and the second sealing member 6 is provided between the end surface 15a of the fifth wall 15 of the casing body 10 and the flat plate-like cover portion 21 of the cover body 20. However, in a case in which the power control apparatus 1 is installed such that the fourth wall 14 of the casing body 10 faces up, the first sealing member 5 may can be provided between the end surface 14a of the fourth wall 14 of the casing body 10 and the flat-plate like cover portion 21 of the cover body 20, without providing the second sealing member 6 between the end surface 15a of the 15 and the flat plate-like cover portion 21 of the cover body 20.

Further, although in the above embodiments the power control apparatus 1 is installed such that the surface 14b of the fourth wall 14 faces up and the extension direction of the first wall 11 is parallel to the vertical direction, this is not restrictive. An installing orientation of the power control apparatus 1 can be changed in a various manners.

REFERENCE SIGNS LIST 1 power control apparatus
2 casing for electrical apparatus
3 electrical apparatus
4 screw
5 first sealing member
6 second sealing member
7 screw
10 casing body
10a housing space
10b opening
11 first wall
11a first side
11b second side
11c third side
11d fourth side
11e partition wall
12 second wall
12a partition wall
12b through hole
13 third wall
13a partition wall
13b trough hole
13c vertical rib
13d horizontal rib
14 fourth wall
14a end surface
14b surface
14c groove-shaped portion
14d flange portion
15 fifth wall
15a end surface
15b groove-shaped portion
15c flange portion
16 flashing portion
17 heat sink
17a first heat sink portion
17b second heat sink portion
17c third heat sink portion
18 screw hole
20 cover body 21 flat plate-like cover portion
21a first side
21b second side
21c third side
21d fourth side
22 first side surface cover portion
23 second side surface cover portion
24 first curved cover portion
25 second curved cover portion
26 attaching hole
30 first partition wall
30b second surface portion
31 second partition wall
31a first surface portion
31b second surface portion
31c third surface portion
31d through hole
32 first auxiliary sealing member
33 second auxiliary sealing member
34 third auxiliary sealing member
35 partition wall sealing member
40 top cover
50 bottom cover
60 communication portion
61 gap
62 gap
A inclination angle

The invention claimed is:

1. A casing for housing an electrical apparatus, the casing comprising:
   a casing body having an opening;
   a cover body that includes a flat plate-shaped cover portion having a rectangular shape and a curved cover portion continuous to one side of the flat plate-like cover portion, the cover body being attached to the casing body to cover the opening;
   a sealing member that is arranged between the casing body and the flat plate-like cover portion and seals between the casing body and the flat plate-shaped cover portion;
   a communication portion that is provided inside the curved cover portion in a manner extending along the one side of the flat plate-shaped cover portion and communicates with an outside between the curved cover portion and the casing body;
   a partition wall attached to the casing body and separating the communication portion from an inside of the casing body; and
   a partition wall sealing member disposed between the partition wall and the flat plate-shaped cover portion to seal between the partition wall and the flat plate-shaped cover portion, wherein
   the partition wall is formed separately from the casing body and the cover body,
   the sealing member is formed from an elastic body or a rubber sponge, and
   the partition wall is formed from a sheet-metal-processed metal plate material.

2. The casing according to claim 1, wherein
   the casing body has a box shape including:
   a first wall having a rectangular shape;
   a second wall continuous to a first side of the first wall;
   a third wall that opposes the second wall and is continuous to a second side of the first wall;
   a fourth wall continuous to a third side of the first wall, the second wall, and the third wall; and
   a fifth wall that opposes the fourth wall and is continuous to a fourth side of the first wall, the second wall, and the third wall,
   the sealing member is arranged in a manner extending parallel to the one side between an end surface of the fourth wall facing opposite from the first wall and the flat plate-shaped cover portion, and
   the curved cover portion is curved from the one side of the flat plate-shaped cover portion toward the first wall.

3. The casing according to claim 2, wherein
   the cover body has a U-shape in cross-section and includes:
   the flat plate-shaped cover portion;
   a first side surface cover portion for covering the second wall;
   a second side surface cover portion for covering the third wall;
   a first curved cover portion continuous to the flat plate-shaped cover portion and the first side surface cover portion; and
   a second curved cover portion continuous to the flat plate-shaped cover portion and the second side surface cover portion, and
   the curved cover portion includes the first curved cover portion and the second curved cover portion.

4. The casing according to claim 2, wherein
   the fourth wall is provided with a flashing portion that extends along the end surface of the fourth wall facing opposite from the first wall and protrudes in a direction away from the fifth wall.

5. The casing according to claim 2, wherein
   a surface of the fourth wall facing an outside of the casing body is inclined to gradually approach the fifth wall from a side of the flat plate-shaped cover portion toward the first wall.

6. The casing according to claim 2, wherein
   the communication portion is formed of a space between the partition wall and the curved cover portion, and
   the space communicates with the outside in a gap between the curved cover portion and the casing body.

7. The casing according to claim 6, wherein
   the casing body includes a flange portion having an arcuate outer peripheral surface and integrally provided between the end surface of the fourth wall and the third wall,
   a radius of the arcuate outer peripheral surface of the flange portion is smaller than a radius of the curved cover portion, and
   the gap is provided between an outer peripheral surface of the flange portion and an inner peripheral surface of the curved cover portion.

8. The casing according to claim 2, wherein
   the partition wall includes
   a flat plate-shaped first surface portion parallel to the third wall,
   a flat plate-shaped second surface portion parallel to the first wall, and
   a third surface portion inclined with respect to both the first surface portion and the second surface portion and integrally provided between the first surface portion and the second surface portion.

9. The casing according to claim 2, further comprising a further partition wall attached to the casing body and separating the communication portion from the inside of the casing body, wherein the opening of the casing body is defined by the end surface of the fourth wall, an end surface of the fifth wall facing opposite from the first wall, the partition wall, and the further partition wall.

10. The casing according to claim 1, wherein the communication portion is a drainage channel extending in an up-down direction of the casing.

11. A power control apparatus, comprising:

a casing; and an electrical apparatus housed in the casing, wherein the casing comprises:

a casing body having an opening;

a cover body that includes a flat plate-shaped cover portion having a rectangular shape and a curved cover portion continuous to one side of the flat plate-like cover portion, the cover body being attached to the casing body to cover the opening;

a sealing member that is arranged between the casing body and the flat plate-like cover portion and seals between the casing body and the flat plate-shaped cover portion;

a communication portion that is provided inside the curved cover portion in a manner extending along the one side of the flat plate-shaped cover portion and communicates with an outside between the curved cover portion and the casing body;

a partition wall attached to the casing body and separating the communication portion from an inside of the casing body; and a partition wall sealing member disposed between the partition wall and the flat plate-shaped cover portion to seal between the partition wall and the flat plate-shaped cover portion, wherein the partition wall is formed separately from the casing body and the cover body, the sealing member is formed from an elastic body or a rubber sponge, and the partition wall is formed from a sheet-metal-processed metal plate material.

* * * * *